US012603257B2

(12) United States Patent
Peng et al.

(10) Patent No.: US 12,603,257 B2
(45) Date of Patent: Apr. 14, 2026

(54) CARRIER RING FOR FLOATING TCP CHAMBER GAS PLATE

(71) Applicant: LAM RESEARCH CORPORATION, Fremont, CA (US)

(72) Inventors: Gordon Peng, San Jose, CA (US); Ambarish Chhatre, Danville, CA (US); Craig Rosslee, San Jose, CA (US); Dan Marohl, San Jose, CA (US); David Setton, Danville, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 485 days.

(21) Appl. No.: 18/026,785

(22) PCT Filed: Sep. 14, 2021

(86) PCT No.: PCT/US2021/050161
§ 371 (c)(1),
(2) Date: Mar. 16, 2023

(87) PCT Pub. No.: WO2022/060688
PCT Pub. Date: Mar. 24, 2022

(65) Prior Publication Data
US 2023/0402264 A1 Dec. 14, 2023

Related U.S. Application Data

(60) Provisional application No. 63/081,252, filed on Sep. 21, 2020.

(51) Int. Cl.
*H01J 37/32* (2006.01)

(52) U.S. Cl.
CPC .... *H01J 37/32715* (2013.01); *H01J 37/3244* (2013.01)

(58) Field of Classification Search
None
See application file for complete search history.

(56) References Cited

U.S. PATENT DOCUMENTS 6,129,808 A 10/2000 Wicker et al.
7,651,584 B2 1/2010 Amikura
(Continued)

FOREIGN PATENT DOCUMENTS

JP 2002280318 A 9/2002
JP 2005203627 A 7/2005
(Continued)

OTHER PUBLICATIONS

International Search Report and Written Opinion of the ISA issued in PCT/US2021/050161, mailed Jan. 3, 2022; ISA/KR.
(Continued)

*Primary Examiner* — Jason Berman

(57) ABSTRACT

A gas distribution assembly for a processing chamber in a substrate processing system includes a gas plate including a plurality of holes configured to supply a gas mixture into an interior of the processing chamber and a carrier ring configured to support the gas plate. The carrier ring includes an annular body and a radially inwardly projecting portion. The radially inwardly projecting portion has a first inner diameter and the annular body has a second inner diameter greater than the first inner diameter, the radially inwardly projecting portion defines a ledge, and the gas plate is arranged on the ledge of the carrier ring. A dielectric window is arranged on the gas plate above the gas plate and the carrier ring such that the gas plate is supported between the carrier ring and the dielectric window.

18 Claims, 4 Drawing Sheets

(56) References Cited

U.S. PATENT DOCUMENTS

| | | | |
|---|---|---|---|
| 8,267,042 B2 | 9/2012 | Ishibashi | |
| 2002/0142611 A1* | 10/2002 | O'Donnell | H01J 37/32477 264/642 |
| 2003/0148623 A1* | 8/2003 | Ohmi | H01J 37/3222 438/709 |
| 2004/0002221 A1 | 1/2004 | O'Donnell et al. | |
| 2004/0092120 A1 | 5/2004 | Wicker | |
| 2009/0291563 A1 | 11/2009 | Ishibashi | |

FOREIGN PATENT DOCUMENTS

| | | |
|---|---|---|
| JP | 2009283765 A | 12/2009 |
| JP | 2010283361 A | 12/2010 |
| JP | 2011137228 A | 7/2011 |
| KR | 20090122113 A | 11/2009 |
| KR | 20110007251 A | 1/2011 |
| KR | 20170075163 A | 7/2017 |
| KR | 101985031 B1 | 5/2019 |
| WO | WO-2010001938 A1 | 1/2010 |
| WO | WO-2012166364 A1 | 12/2012 |

OTHER PUBLICATIONS

Extended European Search Report for European Application No. 21 87 0041 dated Sep. 26, 2024.
Japanese Decision to Grant for Japanese Application No. 2023-518195 dated Sep. 3, 2025.
Japanese Office Action for Japanese Application No. 2023-518195 drafted Mar. 12, 2025.
Korean Office Action for Korean Application No. 10-2023-7013459 dated Jun. 27, 2025.
Taiwanese Examination Opinion for Taiwanese Application No. 110134762 dated Aug. 29, 2025.

* cited by examiner

300

324

312

304

316

308

320

CARRIER RING FOR FLOATING TCP CHAMBER GAS PLATE

CROSS-REFERENCE TO RELATED APPLICATIONS

This application is a U.S. National Phase Application under 35 U.S.C. 371 of International Application No. PCT/US2021/050161, filed on Sep. 14, 2021, which claims the benefit of U.S. Provisional Application No. 63/081,252, filed on Sep. 21, 2020. The entire disclosures of the applications referenced above are incorporated herein by reference.

FIELD

The present disclosure relates to gas distribution devices for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During manufacturing of substrates such as semiconductor wafers, etch processes and deposition processes may be performed within a processing chamber. The substrate is disposed in the processing chamber on a substrate support such as an electrostatic chuck (ESC) or a pedestal. Process gases are introduced via a gas distribution device and plasma is struck in the processing chamber.

Some substrate processing systems may be configured to perform deep silicon etch (DSiE) processing and/or a rapid alternating process (RAP), which includes rapidly switching between etch and deposition processes. For example, a RAP may be used in microelectromechanical system (MEMS) etching, DSiE processing, etc.

SUMMARY

A gas distribution assembly for a processing chamber in a substrate processing system includes a gas plate including a plurality of holes configured to supply a gas mixture into an interior of the processing chamber and a carrier ring configured to support the gas plate. The carrier ring includes an annular body and a radially inwardly projecting portion. The radially inwardly projecting portion has a first inner diameter and the annular body has a second inner diameter greater than the first inner diameter, the radially inwardly projecting portion defines a ledge, and the gas plate is arranged on the ledge of the carrier ring. A dielectric window is arranged on the gas plate above the gas plate and the carrier ring such that the gas plate is supported between the carrier ring and the dielectric window.

In other features, the second inner diameter of the annular body is greater than a diameter of the gas plate. The second inner diameter of the annular body corresponds to a vertical surface at a radially inward perimeter of the ledge, and a thickness of the gas plate is greater than a height of the vertical surface. The carrier ring comprises ceramic. The carrier ring comprises alumina. The carrier ring comprises a same material as the gas plate. The carrier ring is comprised of a material having a same CTE as the gas plate. The carrier ring has an yttrium oxide coating.

In other features, an outer perimeter of the carrier ring includes an annular groove. The gas distribution assembly further includes a lifter ring arranged around the outer perimeter of the carrier ring and the lifter ring includes an annular projection that extends inward into the annular groove of the carrier ring. The gas plate is not in direct contact with the lifter ring. A processing chamber includes the gas distribution assembly, an upper portion of the processing chamber includes a recess and the gas distribution assembly is arranged within the recess, and the gas plate is not in direct contact with the processing chamber.

A processing chamber for a substrate processing system configured to perform transformer coupled plasma processing includes a recess defined in an upper portion of the processing chamber and a carrier ring arranged in the recess. The carrier ring includes an annular body and a radially inwardly projecting portion, the radially inwardly projection portion has a first inner diameter, the annular body has a second inner diameter greater than the first inner diameter, and the projection portion define a ledge. A gas plate is arranged on the ledge of the carrier ring, wherein the gas plate includes a plurality of holes configured to supply a gas mixture into an interior of the processing chamber. A dielectric window is arranged on the gas plate above the gas plate and the carrier ring such that the gas plate is supported between the carrier ring and the dielectric window. The gas plate is not in direct contact with the upper portion of the processing chamber.

In other features, the second inner diameter of the annular body is greater than a diameter of the gas plate. The second inner diameter of the annular body corresponds to a vertical surface at a radially inward perimeter of the ledge. A thickness of the gas plate is greater than a height of the vertical surface. An outer perimeter of the carrier ring includes an annular groove. The processing chamber further includes a lifter ring arranged around the outer perimeter of the carrier ring. The lifter ring includes an annular projection that extends inward into the annular groove of the carrier ring. The gas plate is not in direct contact with the lifter ring.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1A:
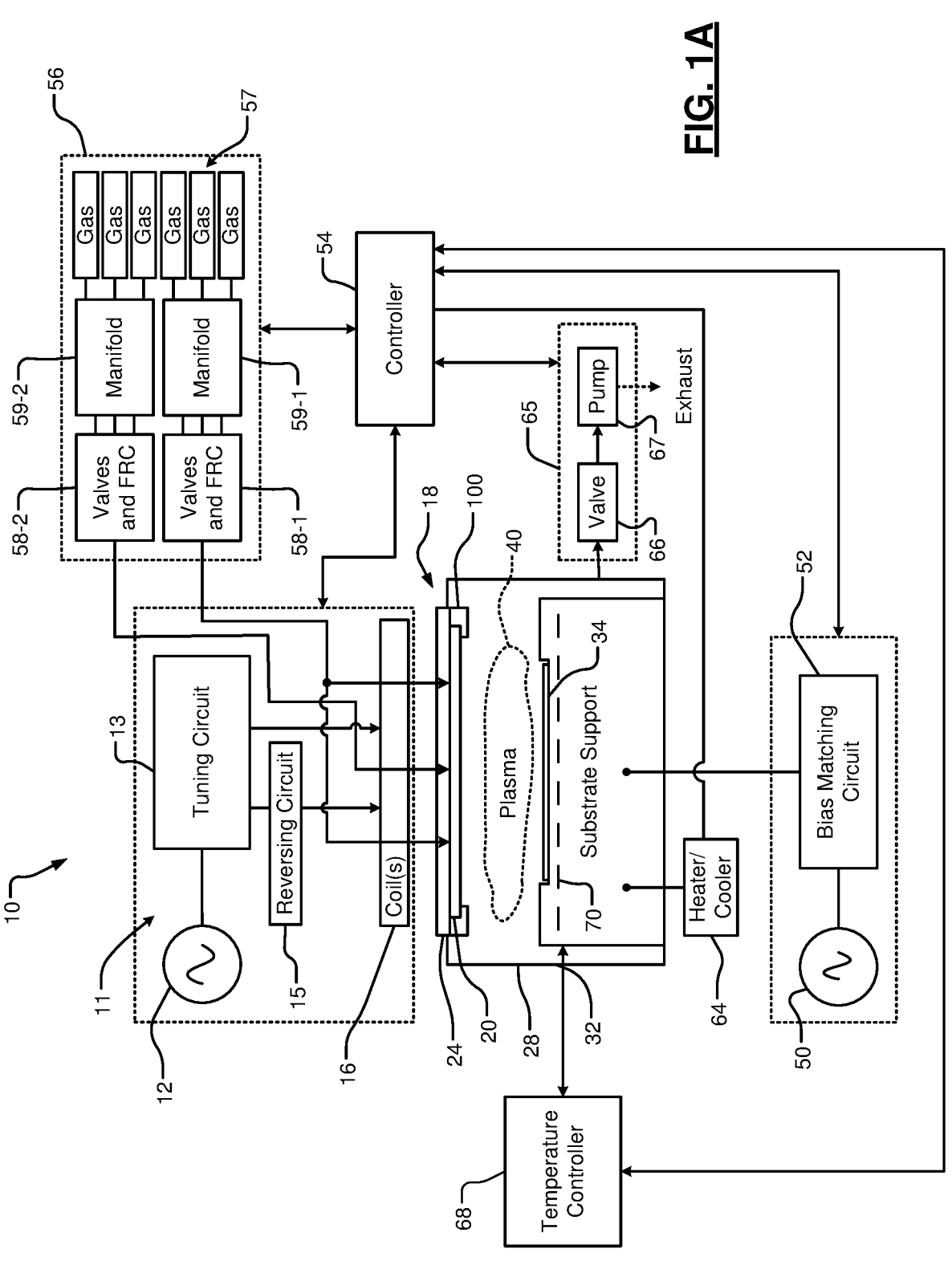
FIG. 1A is a functional block diagram of a substrate processing system including an example carrier ring for a gas distribution device according to the present disclosure.

Substrate processing systems may include a gas distribution device (e.g., a showerhead) arranged in a lid or upper surface of a processing chamber. In processing chambers configured to perform transformer coupled plasma (TCP) processing, the gas distribution device may correspond to an assembly including a gas plate (e.g., a showerhead plate) arranged to face an interior of the processing chamber and a dielectric window arranged above the gas plate. In some examples, a plenum is defined between the gas plate and the dielectric window. Process gas is supplied to the processing chamber via the gas distribution device and plasma is generated inside of the processing chamber. For example, an RF signal is transmitted from TCP coils through the dielectric window into the interior of the processing chamber.

High power and high temperature processes may cause damage and wear to components of the gas distribution device over time. For example, the gas plate is restrained between the dielectric window and a body (e.g., upper ends of the walls) of the processing chamber. Accordingly, thermal expansion caused by high power processes is restricted. Further, surface temperature gradients cause stress across the gas plate (e.g., hoop or cylinder stress that increases with radial distance from a center of the gas plate). The thermal expansion and stress as TCP power increases may cause damage (e.g., cracking) of the gas plate and/or the dielectric window. Further, the heat of the gas plate may be conducted to the body of the processing chamber and/or other components of the substrate processing system, which may cause increased wear and/or other malfunctions (e.g., tripping of interlocks due over-temperature conditions). Damage to surfaces and/or edges of the gas plate (e.g., abrasion or chipping) may also be caused by repeated removal and reassembly.

A gas distribution assembly according to certain embodiments of the present disclosure includes a carrier ring arranged below the gas plate, between the gas plate and the processing chamber. The gas plate is mounted within the carrier ring, and the dielectric window is arranged above the gas plate and the carrier ring. The gas plate is not in direct contact with the processing chamber. The dielectric window is not fixedly attached to the gas plate or the carrier ring and instead is loosely supported on the gas plate. Further, a small gap is provided in a lateral direction between an outer perimeter of the gas plate and the carrier ring. For example, the gap is approximately 0.001" or 0.025 mm (e.g., between 0.00075" and 0.00125", or between 0.019 mm and 0.032 mm). Accordingly, thermal expansion of the gas plate in the lateral direction is not restricted. In some embodiments, an outer perimeter of the carrier ring includes a groove configured to interface with a lifter ring.

The carrier ring may be comprised of a same material as the gas plate or a different material. For example, the carrier ring may be comprised of ceramic, such as alumina or aluminum oxide ($Al_2O_3$), aluminum nitride (AlN), etc. The material of the carrier ring may be selected to have a same or similar coefficient of thermal expansion (CTE) as the gas plate. The carrier ring may be coated in a material having resistance to etching and byproduct materials within the processing chamber, such as yttrium oxide. Accordingly, the carrier ring is resistant to erosion caused by a reactive plasma environment.

The carrier ring functions as a thermal break (e.g., a heat sink) at the outer perimeter of the gas plate. Since thermal gradients are most severe at the outer perimeter of the gas plate, the carrier ring significantly reduces the likelihood of damage caused by thermal expansion. Further, the carrier ring reduces the amount of heat transfer from the gas ring to the body of the processing chamber, which reduces wear (and increases service life) of peripheral components, reduces the likelihood of tripping interlocks, etc. In embodiments including a lifter ring, the lifter ring interfaces with the carrier ring instead of the gas plate. Accordingly, the carrier ring functions as a load bearing contact for the gas plate, the dielectric plate, and other components of the assembly. In this manner, the likelihood of damage to the gas plate and the dielectric plate during removal and reassembly is minimized. If the carrier ring is worn or damaged, the carrier ring can be replaced without replacing the gas plate or other components of the assembly.

Referring now to FIG. 1A, an example of a substrate processing system 10 according to certain embodiments of the present disclosure is shown. The substrate processing system 10 includes a coil driving circuit 11. As shown, the coil driving circuit 11 includes an RF source 12 and a tuning circuit 13. The tuning circuit 13 may be directly connected to one or more inductive transformer coupled plasma (TCP) coils 16. Alternatively, the tuning circuit 13 may be connected by an optional reversing circuit 15 to one or more of the coils 16. The tuning circuit 13 tunes an output of the RF source 12 to a desired frequency and/or a desired phase, matches an impedance of the coils 16 and splits power between the TCP coils 16. The reversing circuit 15 is used to selectively switch the polarity of current through one or more of the TCP coils 16. In some examples, the coil driving circuit 11 implements a transformer coupled capacitive tuning (TCCT) match network to drive the TCP coils 16.

A gas distribution device or assembly 18 includes a showerhead (e.g., a gas plate) 20 and a dielectric window 24. In some embodiments, a plenum may be defined between the gas plate 20 and the dielectric window 24. The gas plate 20 is arranged between the dielectric window 24 and a processing chamber 28. In some embodiments, the dielectric window 24 contains ceramic. In some embodiments, the gas plate 20 comprises ceramic or another dielectric material. The processing chamber 28 further comprises a substrate support (or pedestal) 32. The substrate support 32 may include an electrostatic chuck (ESC), or a mechanical chuck or other type of chuck.

In operation, a process gas is supplied to the processing chamber 28 via the gas plate 20 (e.g., a plurality of holes passing through the gas plate) and plasma 40 is generated inside of the processing chamber 28. For example, an RF signal is transmitted from the TCP coils through the dielectric window 24 into the interior of the processing chamber 28. The RF signal excites gas molecules within the processing chamber 28 to generate plasma 40. The plasma 40 etches an exposed surface of the substrate 34. An RF source 50 and a bias matching circuit 52 may be used to bias the substrate support 32 during operation to control ion energy.

A gas delivery system 56 may be used to supply a process gas mixture to the processing chamber 28. The gas delivery system 56 may include process and inert gas sources 57 (e.g., including deposition gases, etch gases, carrier gases, inert gases, etc.), gas metering systems 58-1 and 58-1 such as valves and flow ratio controllers (e.g., mass flow controllers (MFCs)), and respective manifolds 59-1 and 59-2. For example, the gas metering system 58-1 and the manifold 59-1 may be arranged to provide etch gas mixtures to the processing chamber 28 during etching while the gas metering system 58-2 and the manifold 59-2 may be arranged to provide deposition gas mixtures to the processing chamber 28 during deposition. For example, the etch and deposition gas mixtures may be provided to the plenums of the gas plate 20 through the coil 16 and via respective passages in the dielectric window 24. A heater/cooler 64 may be used to heat/cool the substrate support 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, and so on. Additionally, the controller 54 may control various aspects of the coil driving circuit 11, the RF source 50, and the bias matching circuit 52, etc. In some embodiments, the substrate support 32 is temperature-tunable. In certain embodiments, a temperature controller 68 may be connected to a plurality of heating elements 70, such as thermal control elements (TCEs), arranged in the substrate support 32. The temperature controller 68 may be used to control the plurality of heating elements 70 to control a temperature of the substrate support 32 and the substrate 34.

The gas distribution assembly 18 according to certain embodiments of the present disclosure includes a carrier ring 100 arranged between the gas plate 20 and a body of the processing chamber 28 as described below in more detail.

Figure 1B:
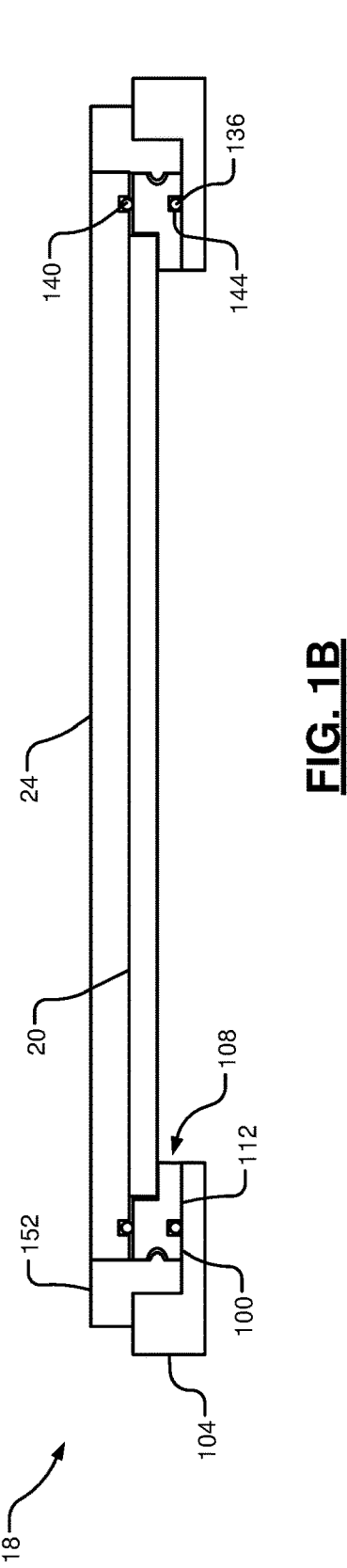
FIG. 1B illustrates an example gas distribution assembly including a carrier ring according to certain embodiments of the present disclosure.
Figure 1C:
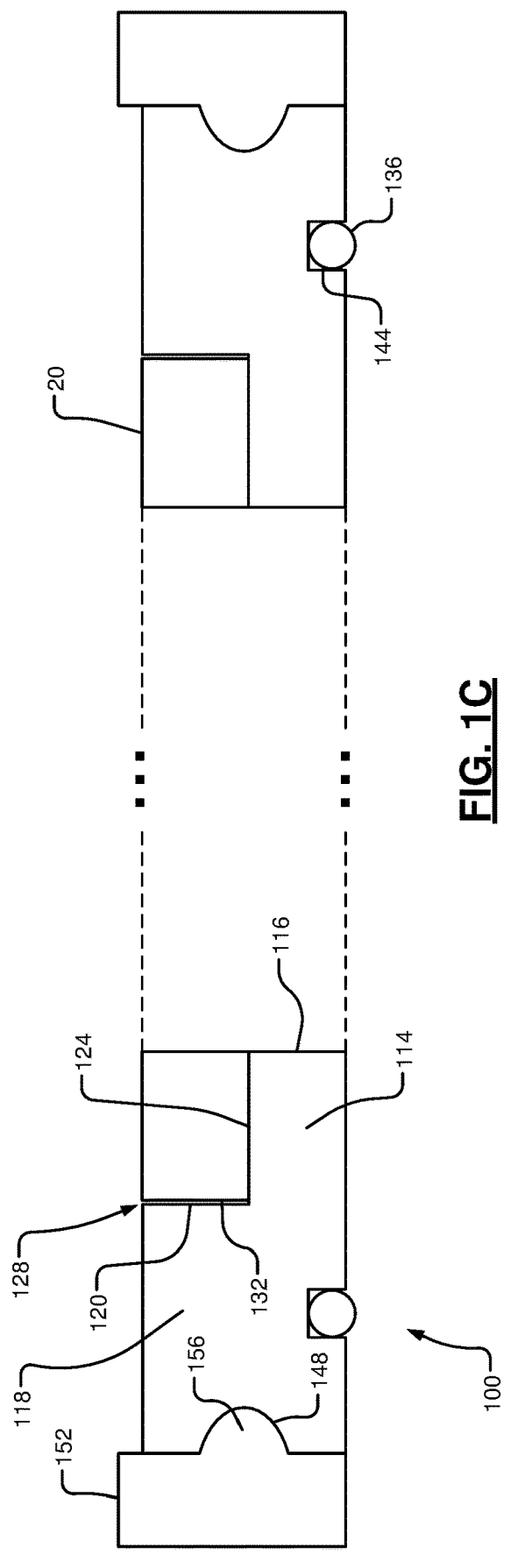
FIG. 1C shows an enlarged view of the example carrier ring and gas plate of FIG. 1B.

Referring now to FIGS. 1B and 1C and with continued reference to FIG. 1A, the gas distribution assembly 18 including the carrier ring 100 is described in more detail. The carrier ring 100 is arranged below the gas plate 20, between the gas plate 20 and an upper portion 104 the processing chamber 28. For example, the upper portion 104 of the processing chamber 28 may correspond to outer walls, a lid, or and upper surface of the processing chamber 28 defining a recess or pocket 108 configured to receive the gas distribution assembly 18. In some embodiments, the carrier ring 100 is supported on a step or ledge 112 within the recess 108 and the gas plate 20 is mounted within the carrier ring 100. For example, a radially inwardly projecting portion 114 has a first inner diameter 116. The projecting portion 114 projects inward from an annular body 118 having a second inner diameter 120 greater than the first inner diameter 116. The first inner diameter 116, the second inner diameter 120, and the projecting portion 114 of the carrier ring 100 define a step or ledge 124 and the gas plate 20 is arranged on the ledge 124.

A small gap 128 is provided in a lateral direction between the second inner diameter 120 of the carrier ring 100 (i.e., a vertical surface located at a radially inward perimeter of the ledge 124) and an outer perimeter 132 of the gas plate 20. In other words, the second inner diameter 120 of the carrier ring 100 is greater than a diameter of the gas plate 20. In some embodiments, the gap 128 is approximately 0.025" or 0.635 mm (e.g., between 0.020" and 0.030", or between 0.508 mm and 0.762 mm). Accordingly, the gas plate 20 "floats" between the carrier ring 100 and the dielectric window 24 and thermal expansion of the gas plate 20 in the lateral direction is not restricted. The dielectric window 24 is arranged above the gas plate 20 and the carrier ring 100. In some embodiments, the dielectric window 24 is not fixedly attached to the gas plate 20 or the carrier ring 100 and instead is loosely supported on the gas plate 20. In other words, the dielectric window 24 is not bonded (e.g., using an adhesive, mechanical fasteners, etc.). Accordingly, the dielectric window 24 does not impede thermal expansion of the gas plate 20.

Referring to FIG. 1B, in some embodiments, sealing members 136 and 140 (e.g., O-rings 136 and 140) are arranged between the carrier ring 100 and the upper portion 104 of the processing chamber 28 and between the carrier ring 100 and the dielectric window 24, respectively. For example, the sealing members 136 and 140 are arranged in grooves 144 in respective surfaces of the carrier ring 100, the upper portion 104 of the processing chamber 28, and the dielectric window 24. The sealing members 136 and 140 seal the processing chamber 28 to maintain vacuum integrity. While one of the grooves 144 is shown in a lower surface of the carrier ring 100, in other embodiments (not shown) the groove 144 may be located in an upper surface of the upper portion 104 (not shown). Similarly, although one of the grooves 144 is shown in a lower surface of the dielectric window 24, in other embodiments (not shown) the groove 144 may be located in an upper surface of the carrier ring 100 (not shown).

In some embodiments, an outer perimeter of the carrier ring 100 includes an annular groove 148 configured to interface with a lifter ring 152. The lifter ring 152 includes an annular projection 156 that extends into the groove 148 to retain the carrier ring 100 and the gas distribution assembly 18 within the lifter ring 152. The gas distribution assembly 18 can be installed into and removed from the processing chamber 28 by lowering and raising the lifter ring 152. The gas plate 20 is not in direct contact with the lifter ring 152 or the walls/extensions of the processing chamber 28. Instead, the carrier ring 100 is in direct contact with the lifter ring 152 and the walls/extensions of the processing chamber 28. Accordingly, the carrier ring 100 functions as a load bearing contact for the gas plate 20 and the dielectric window 24 when the lifter ring 152 is used to remove the gas distribution assembly 18.

The carrier ring 100 may be comprised of the same material as the gas plate 20 or be comprised of a different material. In some embodiments, the carrier ring 100 may be comprised of ceramic, such as alumina or aluminum oxide (Al$_2$O$_3$), aluminum nitride (AlN), etc. In some embodiments, the material of the carrier ring 100 may have a coefficient of thermal expansion (CTE) that is the same as or similar to (e.g., within 5% of) the CTE of the gas plate 20. In some embodiments, the carrier ring 100 may be coated in a material having resistance to etching and byproduct materials within the processing chamber, such as yttrium oxide. Accordingly, the carrier ring 100 is resistant to erosion caused by a reactive plasma environment.

Figure 2:
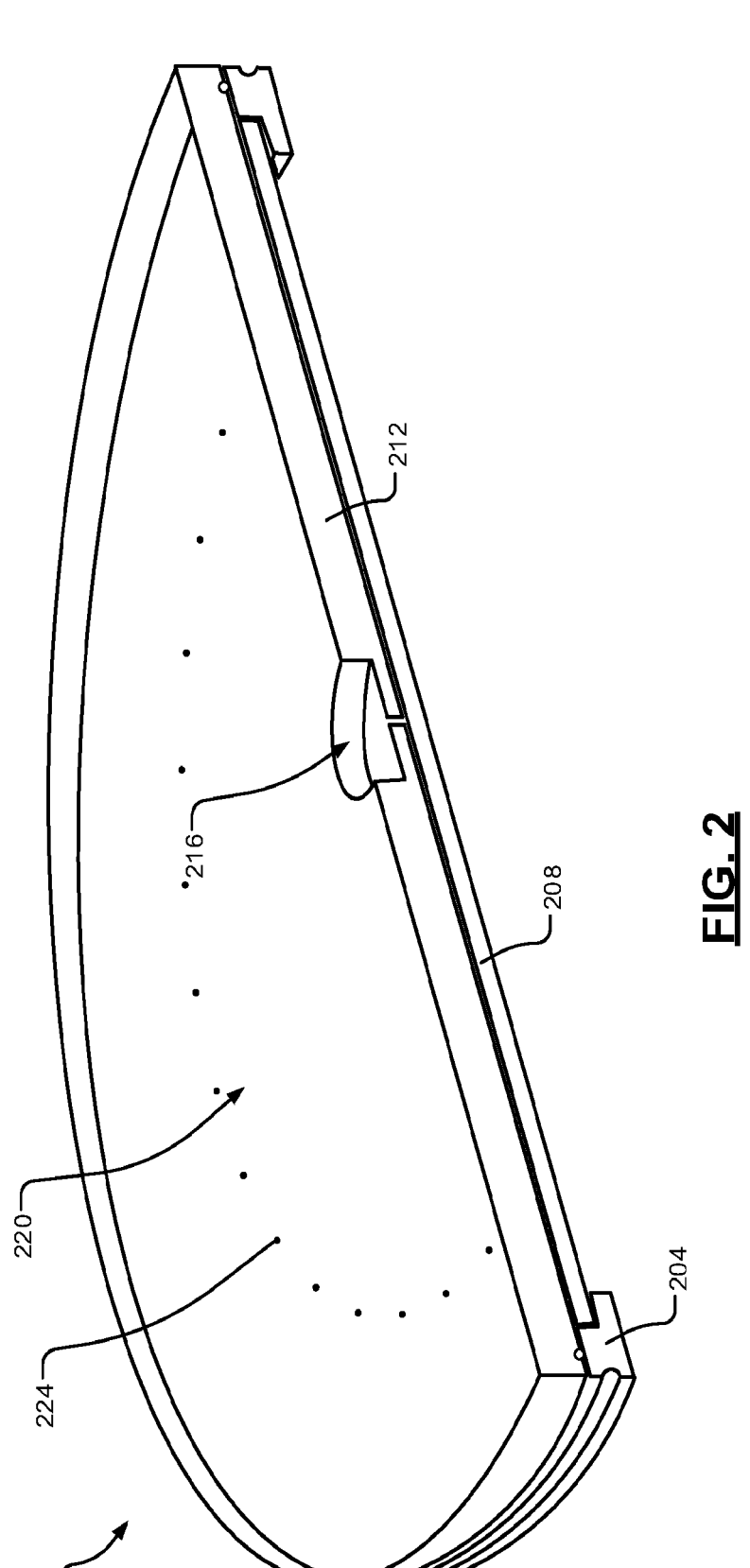
FIG. 2 is an isometric view of an example gas distribution assembly including a carrier ring according to certain embodiments of the present disclosure.

FIG. 2 is an isometric view of an example gas distribution assembly 200 including a carrier ring 204 according to certain embodiments of the present disclosure. The carrier ring 204 is configured to support a gas plate 208 as described above in FIGS. 1A, 1B, and 1C. A dielectric window 212 is arranged above the carrier ring 204 and the gas plate 208 such that the gas plate 208 is supported between the carrier ring 204 and the dielectric window 212.

In some embodiments, the dielectric window 212 includes an in inlet or opening 216. During plasma processing, a gas mixture is supplied to the processing chamber through the gas distribution assembly 200 through the opening 216 in the dielectric window 212. For example, a plenum 220 is defined between the dielectric window 212 and the gas plate 208. The gas mixture supplied through the opening 216 is distributed throughout the plenum 220 and into the processing chamber through a plurality of holes 224.

Figure 3:
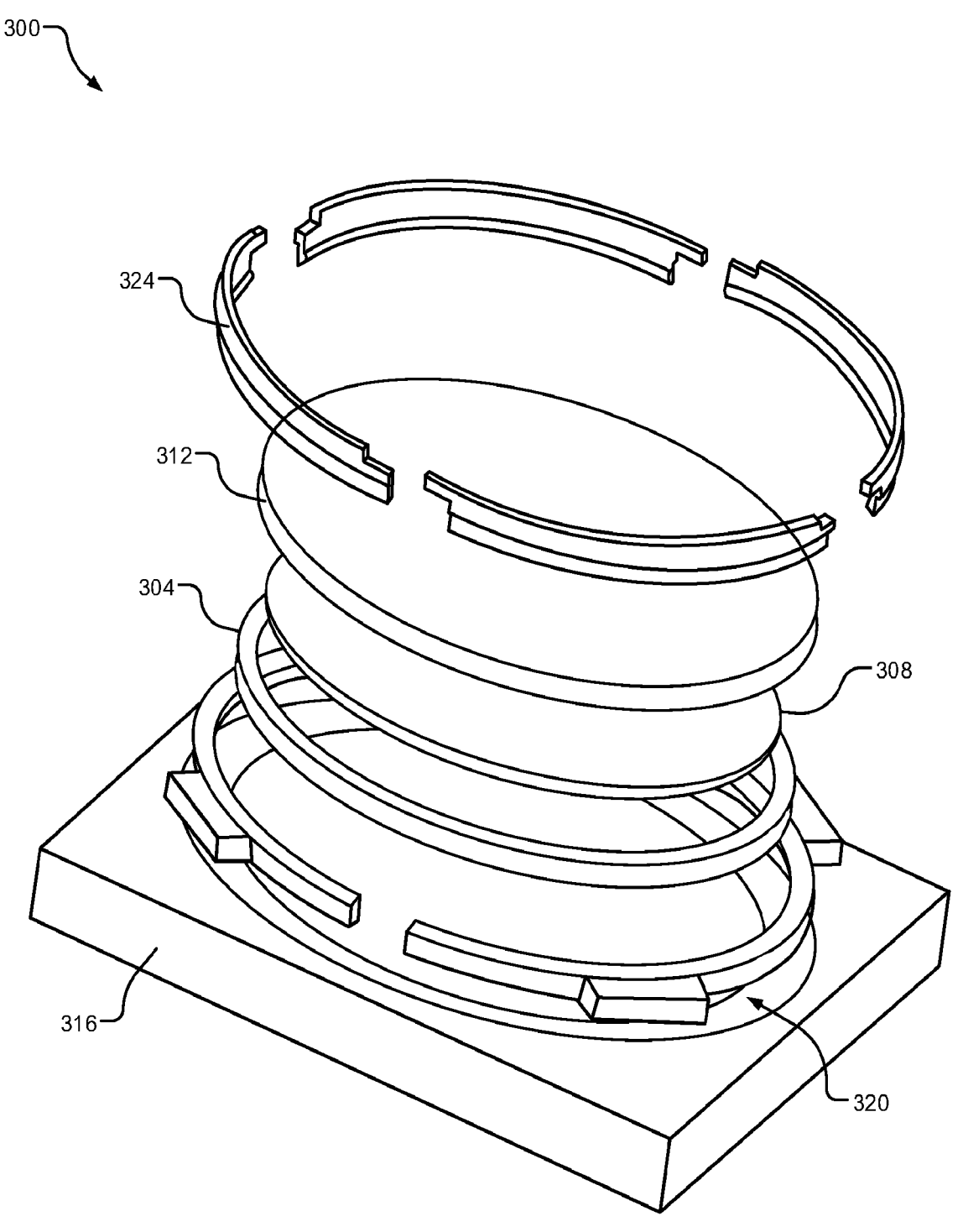
FIG. 3 is an exploded view of a gas distribution assembly including a carrier ring according to certain embodiments of the present disclosure.

FIG. 3 is an exploded view of a gas distribution assembly 300 including a carrier ring 304, a gas plate 308, and a dielectric window 312 according to certain embodiments of the present disclosure. An upper portion 316 of a processing chamber defines a recess 320 configured to receive the gas distribution assembly 300. The carrier ring 304 is configured to support the gas plate 308 as described above in FIGS. 1A, 1B, and 1C. The dielectric window 312 is arranged above the carrier ring 304 and the gas plate 308 such that the gas plate 308 is supported between the carrier ring 304 and the dielectric window 312.

A lifter ring 324 is arranged around an outer perimeter of the carrier ring 304. For example, the lifter ring 324 includes an annular projection (e.g., the annular projection 156 as shown in FIG. 1C) that extends inward into an annular groove in the outer perimeter of the carrier ring 304. When assembled and installed within the recess 320 in the upper portion 316 of the processing chamber, the gas plate 308 is not in directed contact with either of the upper portion 316 of the processing chamber or the lifter ring 324.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas distribution assembly for a processing chamber in a substrate processing system, the gas distribution assembly comprising:

a gas plate including a plurality of holes configured to supply a gas mixture into an interior of the processing chamber;

a carrier ring configured to support the gas plate, wherein the carrier ring includes an annular body and a radially inwardly projecting portion, wherein the radially inwardly projecting portion has a first inner diameter and the annular body has a second inner diameter greater than the first inner diameter, wherein the radially inwardly projecting portion defines a ledge, and wherein the gas plate is arranged on the ledge of the carrier ring; and a dielectric window arranged on the gas plate above the gas plate and the carrier ring with a gap provided in a lateral direction between the second inner diameter of the carrier ring and an outer perimeter of the gas plate such that the gas plate floats between the carrier ring and the dielectric window.

2. The gas distribution assembly of claim 1, wherein the second inner diameter of the annular body is greater than a diameter of the gas plate.

3. The gas distribution assembly of claim 1, wherein the second inner diameter of the annular body corresponds to a vertical surface at a radially inward perimeter of the ledge, and wherein a thickness of the gas plate is greater than a height of the vertical surface.

4. The gas distribution assembly of claim 1, wherein the carrier ring comprises ceramic.

5. The gas distribution assembly of claim 1, wherein the carrier ring comprises alumina.

6. The gas distribution assembly of claim 1, wherein the carrier ring comprises a same material as the gas plate.

7. The gas distribution assembly of claim 1, wherein the carrier ring is comprised of a material having a same CTE as the gas plate.

8. The gas distribution assembly of claim 1, wherein the carrier ring has an yttrium oxide coating.

9. The gas distribution assembly of claim 1, wherein an outer perimeter of the carrier ring includes an annular groove.

10. The gas distribution assembly of claim 9, further comprising a lifter ring arranged around the outer perimeter of the carrier ring, wherein the lifter ring includes an annular projection that extends inward into the annular groove of the carrier ring.

11. The gas distribution assembly of claim 10, wherein the gas plate is not in direct contact with the lifter ring.

12. A processing chamber including the gas distribution assembly of claim 11, wherein an upper portion of the processing chamber includes a recess and the gas distribution assembly is arranged within the recess, and wherein the gas plate is not in direct contact with the processing chamber.

13. A processing chamber for a substrate processing system configured to perform transformer coupled plasma processing, the processing chamber comprising:

a recess defined in an upper portion of the processing chamber;

a carrier ring arranged in the recess, wherein the carrier ring includes an annular body and a radially inwardly projecting portion, wherein the radially inwardly projection portion has a first inner diameter, wherein the annular body has a second inner diameter greater than the first inner diameter, and wherein the radially inwardly projecting portion define a ledge;

a gas plate arranged on the ledge of the carrier ring, wherein the gas plate includes a plurality of holes configured to supply a gas mixture into an interior of the processing chamber; and a dielectric window arranged on the gas plate above the gas plate and the carrier ring with a gap provided in a lateral direction between the second inner diameter of the carrier ring and an outer perimeter of the gas plate such that the gas plate floats between the carrier ring and the dielectric window, wherein the gas plate is not in direct contact with the upper portion of the processing chamber.

14. The processing chamber of claim 13, wherein the second inner diameter of the annular body is greater than a diameter of the gas plate.

15. The processing chamber of claim 13, wherein the second inner diameter of the annular body corresponds to a vertical surface at a radially inward perimeter of the ledge, and wherein a thickness of the gas plate is greater than a height of the vertical surface.

16. The processing chamber of claim 13, wherein an outer perimeter of the carrier ring includes an annular groove.

17. The processing chamber of claim 16, further comprising a lifter ring arranged around the outer perimeter of the carrier ring, wherein the lifter ring includes an annular projection that extends inward into the annular groove of the carrier ring.

18. The processing chamber of claim 17, wherein the gas plate is not in direct contact with the lifter ring.

* * * * *